US006107985A

United States Patent [19]

Walukas et al.

[11] Patent Number: 6,107,985

[45] Date of Patent: Aug. 22, 2000

[54] BACKLIGHTING CIRCUITS INCLUDING BROWNOUT DETECTION CIRCUITS RESPONSIVE TO A CURRENT THROUGH AT LEAST ONE LIGHT EMITTING DIODE AND RELATED METHODS

[75] Inventors: Joel J. Walukas, Cary; John W. Northcutt, Chapel Hill, both of N.C.

[73] Assignee: Ericsson Inc., Research Triangle Park, N.C.

[21] Appl. No.: 08/961,456

[22] Filed: Oct. 30, 1997

[51] Int. Cl.[7] .......................... G09G 3/36; H03K 5/153; G08B 21/00

[52] U.S. Cl. .......................... 345/102; 327/89; 340/636

[58] Field of Search .......................... 345/102, 82, 211, 345/212; 349/61, 69; 315/119, 121, 122, 123, 124, 127, 128, 224, 225, 291, 307, 310, 311, 66; 340/825.82, 636; 362/800; 324/426; 327/89; 363/89; 323/282; 455/566, 572, 574

[56] References Cited

U.S. PATENT DOCUMENTS

| | | | |
|---|---|---|---|
| 4,237,405 | 12/1980 | Kellis | 315/307 |
| 4,251,151 | 2/1981 | Toyota | 340/636 |
| 4,504,776 | 3/1985 | Haville | 323/288 |
| 5,077,832 | 12/1991 | Szczuthowski et al. | 455/566 |
| 5,487,181 | 1/1996 | Dailey et al. | 455/575 |
| 5,585,749 | 12/1996 | Pace et al. | 327/89 |
| 5,623,533 | 4/1997 | Kikuchi et al. | 455/572 |
| 5,661,645 | 8/1997 | Hochstein | 363/89 |
| 5,684,404 | 11/1997 | Miller | 324/426 |
| 5,724,651 | 3/1998 | Takahashi et al. | 455/343 |
| 5,744,984 | 4/1998 | Drapac et al. | 327/89 |
| 5,784,295 | 7/1998 | Hinohara | 340/636 |
| 5,929,775 | 7/1999 | Tsuchiyama | 340/636 |

*Primary Examiner*—Steven J. Saras
*Assistant Examiner*—Paul A. Bell
*Attorney, Agent, or Firm*—Myers Bigel Sibley & Sajovec

[57] ABSTRACT

A backlighting circuit for user interface in an electronic device includes at least one light emitting diode optically coupled to the user interface wherein the at least one light emitting diode provides backlighting for the user interface. A current source is electrically coupled in series with the at least one light emitting diode wherein the current source controls a current through the at least one diode. In addition, a brownout detection circuit determines a brownout condition for the user interface responsive to the current through the diode. Related communications devices and methods are also discussed.

20 Claims, 7 Drawing Sheets

BACKLIGHTING CIRCUITS INCLUDING BROWNOUT DETECTION CIRCUITS RESPONSIVE TO A CURRENT THROUGH AT LEAST ONE LIGHT EMITTING DIODE AND RELATED METHODS

FIELD OF THE INVENTION

The present invention relates to the field of electronics and more particularly to backlighting circuits and methods for electronic devices.

BACKGROUND OF THE INVENTION

In general, a cellular radiotelephone includes a transceiver for transmitting and receiving radio communications to and from a radio base station, a controller for controlling the transmission and reception of the radio communications, and a user interface. More particularly, the user interface can include a keypad for accepting data input from a user and a visual display (such as a liquid crystal display) for providing information to the user. Furthermore, many cellular radiotelephones are battery operated allowing mobility during use.

In addition, backlighting can be used to illuminate the user interface. For example, one or more light emitting diodes (LEDs) can be used to provide backlighting to the user interface. In particular, keypad backlighting has been implemented using arrays of yellow-green (570 nm) light emitting diodes (LEDs). An array including a plurality of pairs of light emitting diodes (LEDs) 33 has been used wherein each of the LEDs in a pair are connected in series and wherein each of the series connected pairs of light emitting diodes are connected in parallel as shown in FIG. 1. The six parallel light emitting diode circuits are switched ON or OFF through the common NPN transistor 21.

The current through the collector of the common NPN transistor 21 is controlled using the voltage reference made up of the resistors 23 and 25, and the diode 27. A resistor 29 is also provided between the emitter of the transistor 21 and ground. Furthermore, a resistor 31 is connected in series with each of the pairs of series connected LEDs 33. As will be understood by one having skill in the art, the voltage at the base of the transistor 21 can be determined using the formula:

$$V_{BASE}=V_{BE}+V_R$$

where $V_{BASE}$ is the voltage at the base of transistor 21, $V_{BE}$ is the voltage between the base and the emitter of transistor 21, and $V_R$ is the voltage across the resistor 29. Increasing the collector current will thus increase $V_R$ thereby reducing $V_{BE}$ and limiting the collector current. The transistor 21 thus acts as a simple current source and operates in the linear forward active region of the transistor.

The collector current may be affected by a number of variables including the output impedance of the BACKLIGHT source signal; the process variations and temperature dependence of the forward voltage of diode 27; the process variations and temperature dependence of $V_{BE}$; and the temperature coefficients of and tolerances of resistors 23 and 25. Given these uncontrolled process and environmental variables, the collector current through transistor 21 may be unreliable without allowing for relatively wide tolerances.

When using a 5 cell rechargeable battery to operate the cellular radiotelephone, sufficiently wide tolerances may be available. In general, a 5 cell rechargeable battery has a typical operating voltage of 5.0V to 7.0V. This operating range may provide ample voltage over the life of the battery to overcome the forward voltage ($V_F$) of the two series LEDs 33, the collector-emitter voltage of the NPN transistor 21, and the voltage across the degeneration resistor 29. Assuming that the saturation current ($V_{SAT}$) through transistor 21 is 200 mV, and ignoring the effects of the degeneration resistor 29, the minimum battery voltage required to guarantee backlighting can be calculated as follows:

$$V_{RD}+2(V_{FD})+V_{CE}=0.0V+2(2.2V)+2.2V+0.2V=4.6V.$$

where $V_{RD}$ is the voltage across the diode resistor 31, $V_{FD}$ is the forward voltage across one of the LEDs 33, and $V_{CE}$ is the collector to emitter voltage of the transistor 21.

The forward voltage $V_{FD}$ of a light emitting diode (LED) 33 is dependent on the conduction current through the LED, the ambient temperature, and the process variations from diode to diode. Accordingly, the LED forward voltage is typically less than the 2.2V listed in the manufacturer data sheets. FIG. 2 is a graph illustrating data collected in the laboratory using the backlighting circuit of FIG. 1 implemented with six pairs of series connected LEDs with the LED pairs being connected in parallel wherein each of the LEDs is a yellow-green 570 nm LED. The data used to generate this graph is provided below in Table 2.

TABLE 2

| | V 80 dgs | I | V 60 dgrs | I | V 25 dgrs | I | V 0 dgrs | I | V (−)30 dgrs | I |
|---|---|---|---|---|---|---|---|---|---|---|
| 10 | 3.548 | 10.357 | 3.604 | 10.091 | 3.729 | 10.308 | 3.819 | 10.42 | 3.94 | 10.15 |
| 20 | 3.653 | 20.594 | 3.708 | 20.291 | 3.821 | 20.32 | 3.905 | 20.312 | 4.03 | 20.55 |
| 30 | 3.727 | 30.522 | 3.782 | 30.555 | 3.886 | 30.05 | 3.968 | 30.408 | 4.09 | 30.301 |
| 40 | 3.788 | 40.079 | 3.84 | 40.13 | 3.94 | 40.413 | 4.018 | 39.801 | 4.15 | 40.599 |
| 50 | 3.846 | 50.413 | 3.894 | 50.012 | 4 | 50.815 | 4.07 | 50.808 | 4.2 | 50.275 |
| 60 | 3.899 | 60.461 | 3.95 | 60.645 | 4.04 | 60.44 | 4.11 | 60.399 | 4.25 | 60.563 |
| 70 | 3.95 | 70.314 | 3.992 | 70.141 | 4.08 | 70.033 | 4.15 | 70.105 | 4.3 | 70.559 |
| 80 | 3.99 | 80.111 | 4.04 | 80.213 | 4.13 | 80.06 | 4.19 | 80.601 | 4.34 | 80.665 |

The voltage difference between the circuit input $V_{SWDC}$ and the voltage at the collector of the transistor 21 was measured for various collector currents and temperatures for applications designed for a diode conduction current in the range of 8 mA to 12 mA (48 mA to 72 mA total) for a typical radiotelephone operating according to the DAMPS standard using a 5 cell rechargeable battery. As shown, a minimum voltage of 4.3 volts may be required to maintain forward conduction at cold temperatures in the range of −30° C. These curves also indicate that the compliance limits of the circuit may be exceeded as the voltage drops below 4.3V thereby reducing the current through the LEDs. In this condition, the user may notice keypad backlight dimming or "brownout".

The backlighting circuit of FIG. 1 may provide acceptable performance for a radiotelephone powered by a 5 cell rechargeable battery as discussed above. This backlighting circuit, however, may not provide acceptable performance when used in a radiotelephone powered by a 4 cell NiCD/NiMH rechargeable battery which may provide a normal operating voltage in the range of 4.0V to 5.7V with an "end-of-life" voltage set at 4.2V. A typical discharge curve for a 4 cell battery is illustrated in FIG. 3. As shown, the end-of-life voltage is set at 4.2V.

Assuming that the saturation voltage of transistor 21 is 200 mV and assuming that there is a 4.3V drop across the LED array, a minimum of 4.5V is required to guarantee consistent backlighting operation. The LEDs would thus provide relatively consistent lighting at the upper end of the battery voltage range, but the LEDs could be expected to fade or turn off as the battery voltage drops below 4.5V. Furthermore, LED fading could be expected to occur at higher battery voltages in low temperature conditions and/or with LEDs having less than the average forward voltage as a result of standard process variations.

Raising the "end-of-life" voltage setting can reduce the occurrence of backlight brownout. For example, the nominal "end-of-life" voltage can be set to 4.6V to provide consistent backlighting operation. As shown in FIG. 3, however, this approach could reduce the useful operating time for the battery by as much as 25%.

Alternately, the LED array can be arranged with all of the LEDs in parallel thereby reducing the voltage drop across the LED array. This arrangement, however, may double the current consumed by the backlighting circuit and double the heat generated thereby. The power consumed by the backlighting circuit is thus undesirably increased. Accordingly, there continues to exist a need in the art for improved backlighting circuits.

SUMMRY OF THE INVENTION

It is therefore an object of the present invention to provide improved backlighting circuits and methods for user interfaces on electronic devices.

This and other objects are provided according to the present invention by a backlighting circuit including at least one light emitting diode optically coupled to a user interface of an electronic device wherein the at least one light emitting diode provides backlighting for the user interface. A constant current source is electrically coupled in series with the at least one light emitting diode wherein the current source controls the current through the at least one diode. In addition, a brownout detection circuit determines a brownout condition for the user interface responsive to the current through the at least one light emitting diode. The brownout detection circuit thus provides the information that the backlighting circuit has entered a brownout condition. Accordingly, a controller coupled to the brownout detection circuit can turn the current source off in response to a determination that the brownout condition has occurred. Alternately, the control circuit can turn off the electronic device allowing an orderly shutdown thereof.

More particularly, the brownout detection circuit can include an analog-to-digital converter, or a comparator. The analog-to-digital converter provides a signal representing the current through the at least one light emitting diode, while the comparator provides an indication that the current through the at least one diode has dropped below a predetermined threshold. Accordingly, the use of a comparator in the brownout detection circuit allows the use of an interrupt service routine in the controller thereby reducing the operations required of the controller to detect a brownout condition.

The current source can control the current through the at least one diode in response to a comparison between a reference signal and a feedback signal from the current source. More particularly, the current source can include a transistor electrically coupled in series between the diode and a feedback node, and a program resistor electrically coupled in series between the feedback node and a ground voltage node. In addition, an operational amplifier includes a first input electrically coupled to the reference signal, a second input electrically coupled to the feedback signal of the feedback node, and an output electrically coupled to a control electrode of the transistor. Accordingly, the operational amplifier drives the control node of the transistor in response to the comparison of the reference signal and the feedback signal. The current through the at least one light emitting diode can thus be controlled within precise tolerances as long as the battery voltage is above a predetermined threshold. Moreover, the at least one light emitting diode can include a plurality of pairs of series coupled light emitting diodes wherein each of the pairs of series coupled light emitting diodes is electrically coupled in parallel. By connecting LEDs in series, the current needed to drive the LED array can be reduced.

The backlighting circuit discussed above can thus be advantageously incorporated in a radio communications device. For example, the backlighting circuit can be used to provide illumination for a user interface such as a keypad or a liquid crystal display. Moreover, the backlighting circuit can be used to increase the operating life of a four-cell battery used to power the radio communications device. In other words, a four-cell NiCD/NiMH rechargeable battery having a normal operating voltage in the range of 4.0V to 5.7V can be used in combination with the backlighting circuit of the present invention to provide consistent illumination and to reduce brownout.

According to an alternate aspect of the present invention, a method for providing backlighting for an electronic device including a user interface and at least one light emitting diode optically coupled thereto includes the step of determining a brownout condition for the at least one diode responsive to a current through the at least one diode. Upon determination of a brownout condition, the diode can be turned off, or the electronic device can be turned off. In particular, the step of determining the brownout condition can include determining that the current through the at least one diode has dropped below a predetermined threshold. This method can further include the steps of comparing a feedback signal representative of a current through the at least one diode with the reference signal and controlling a current through the at least one diode in response to the comparison between the reference signal and the feedback signal.

According to the circuits and methods discussed above, consistent backlighting can be provided for an electronic device using batteries with relatively low operating voltages.

DETAILED DESCRIPTION

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Figure 1:
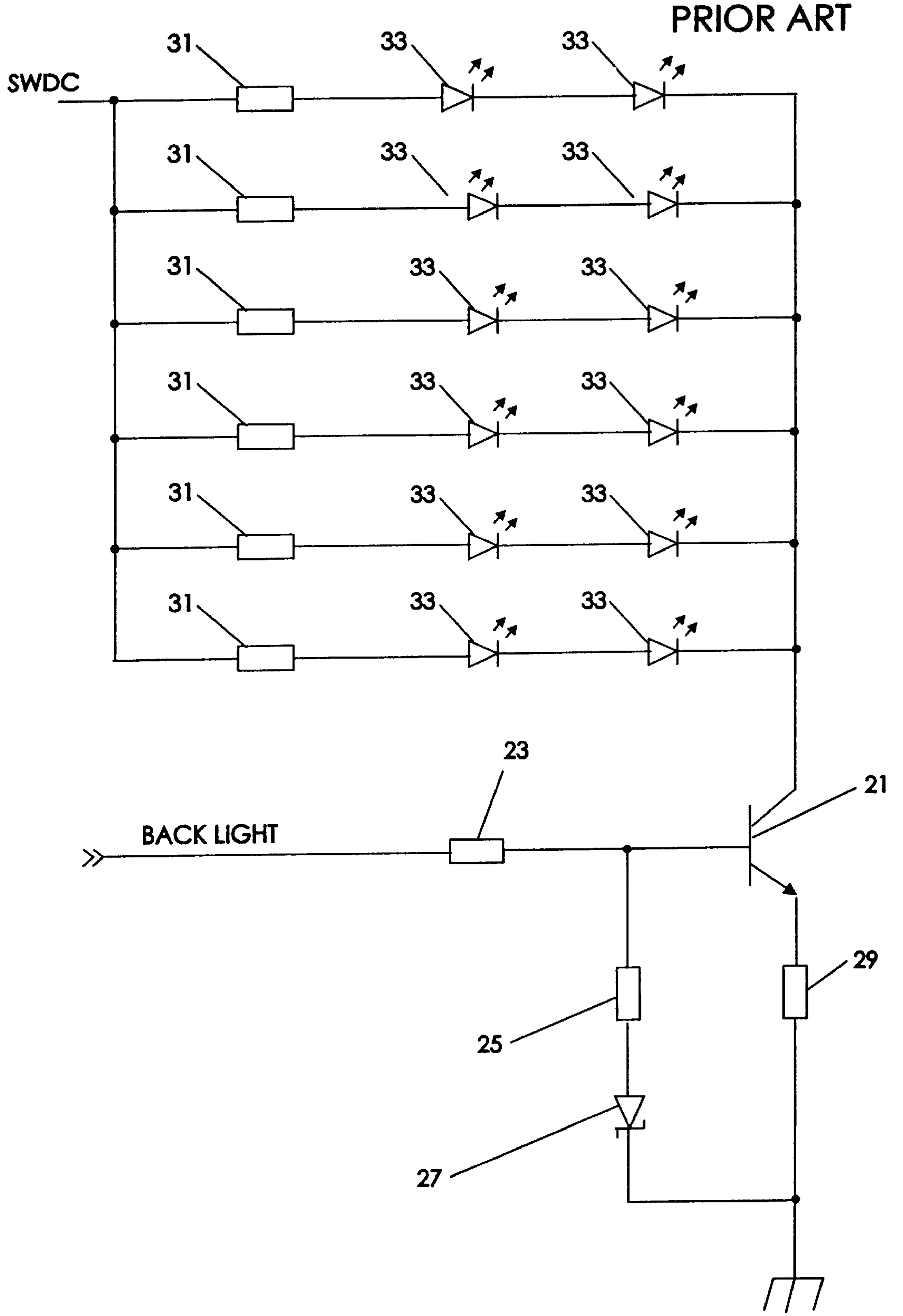
FIG. 1 PRIOR ART
FIG. 1 is a circuit diagram illustrating a backlighting circuit for a keypad of a cellular radiotelephone according to the prior art.
Figure 2:
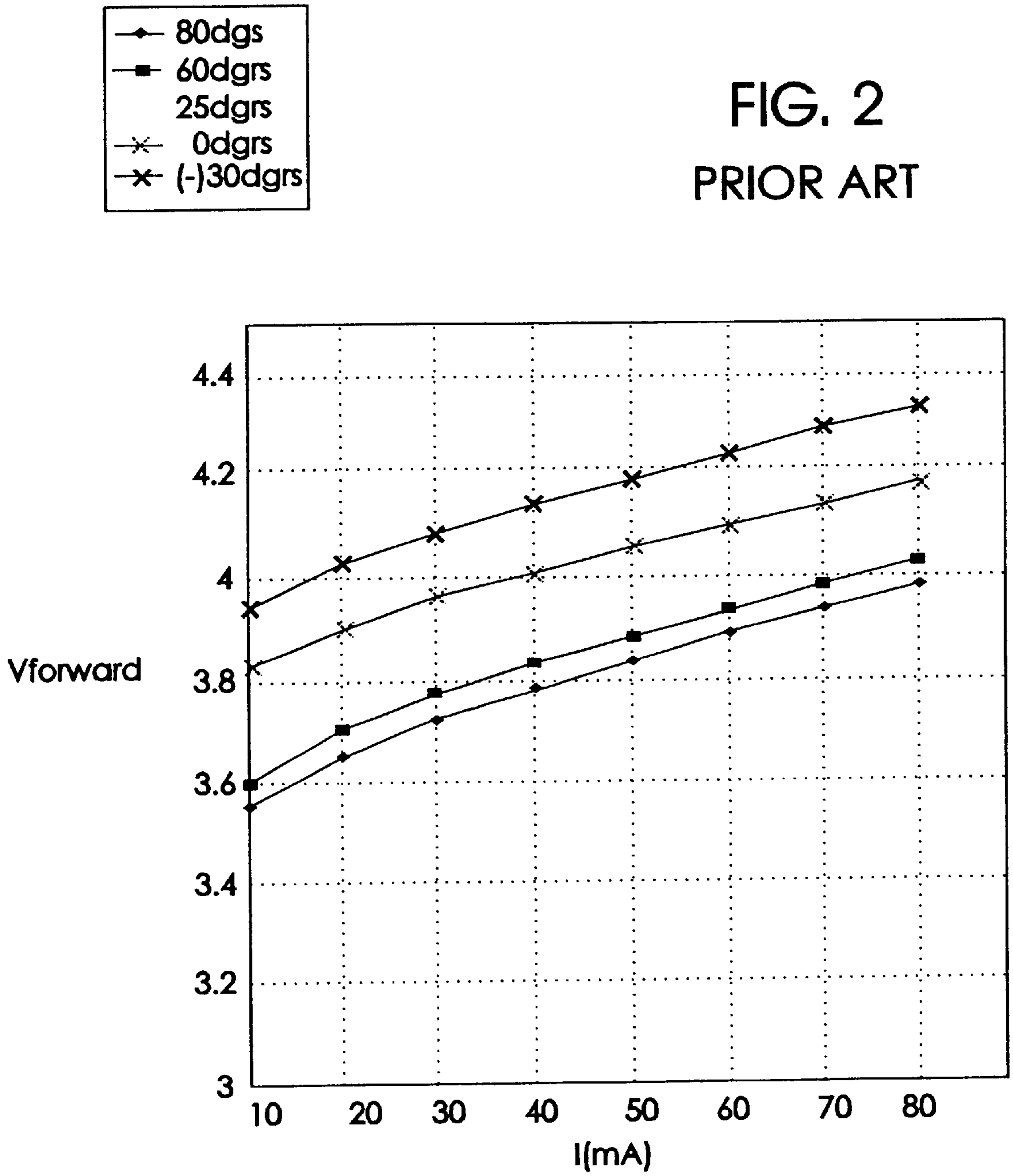
FIG. 2 PRIOR ART
FIG. 2 is a graph illustrating the voltage drop across the light emitting diode array of the backlighting circuit of FIG. 1.
Figure 3:
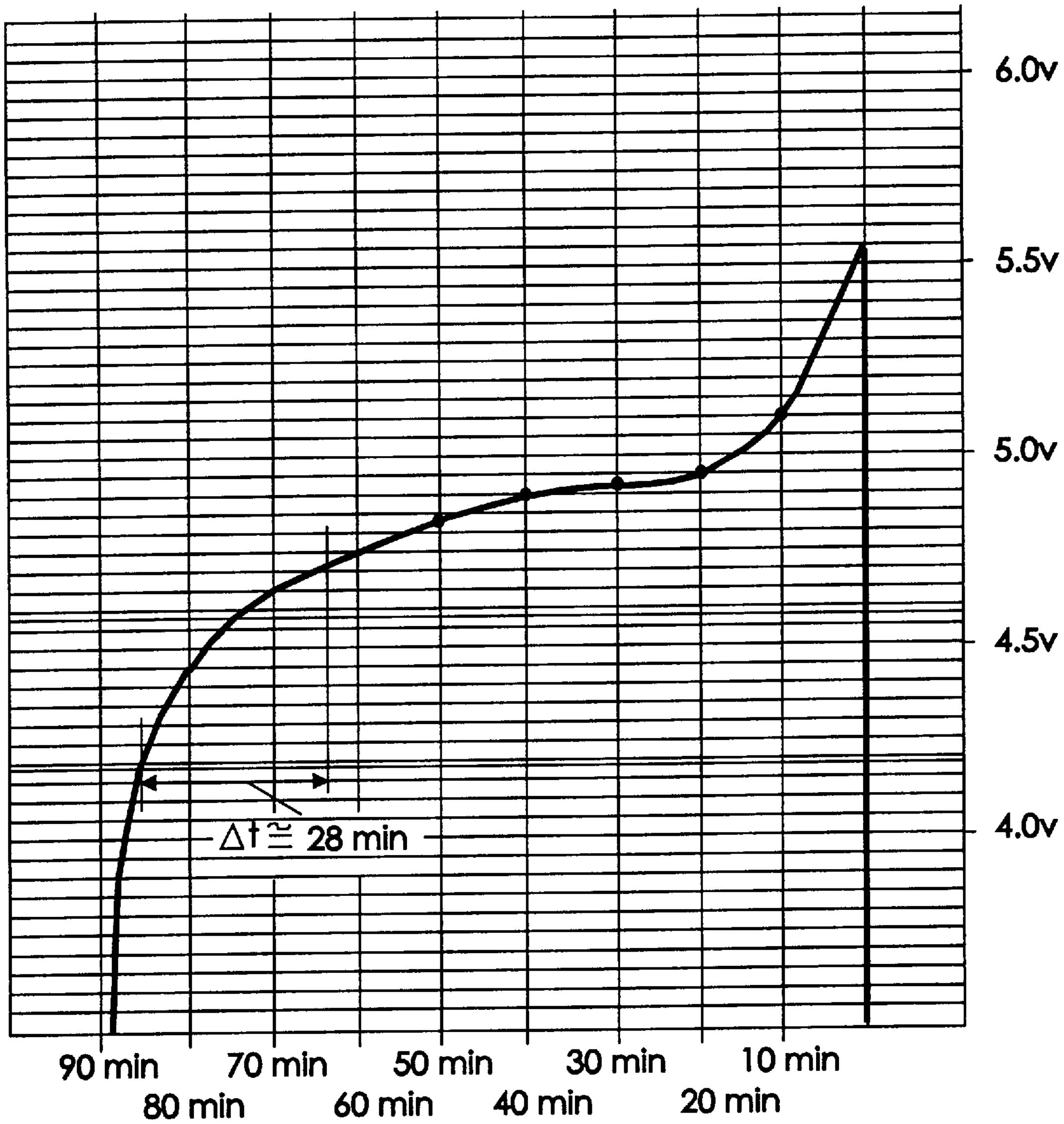
FIG. 3 PRIOR ART
FIG. 3 is a graph illustrating a discharge curve for a 4 cell battery according to the prior art.
Figure 4:
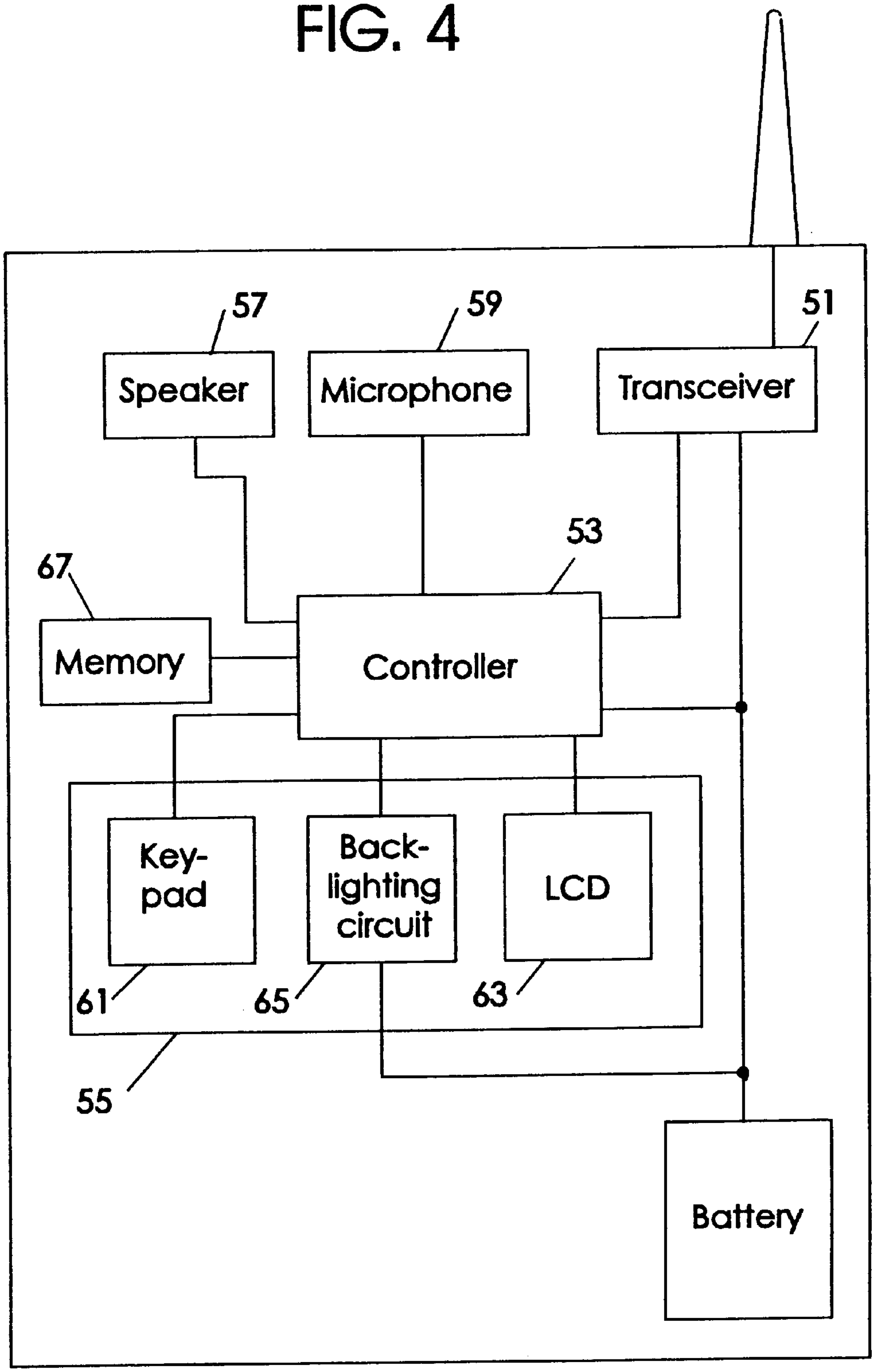
FIG. 4 is a block diagram illustrating a cellular radiotelephone according to the present invention.

FIG. 4 is a block diagram illustrating a cellular radiotelephone according to the present invention. As shown, this cellular radiotelephone includes a transceiver 51 for transmitting and receiving radio communications to and from a radio base station, a controller 53 for controlling the transmission and reception of radio communications, and a user interface 55 for accepting information from the user and/or for providing information to the user. The cellular radiotelephone of FIG. 4 also includes a speaker 57 for providing voice communications to the user, and a microphone 59 for accepting voice communications from the user. As will be understood by those having skill in the art, the term radiotelephone can also be defined to include portable electronic devices such as data phones and personal digital assistants that combine communications and computing capabilities.

Figure 5:
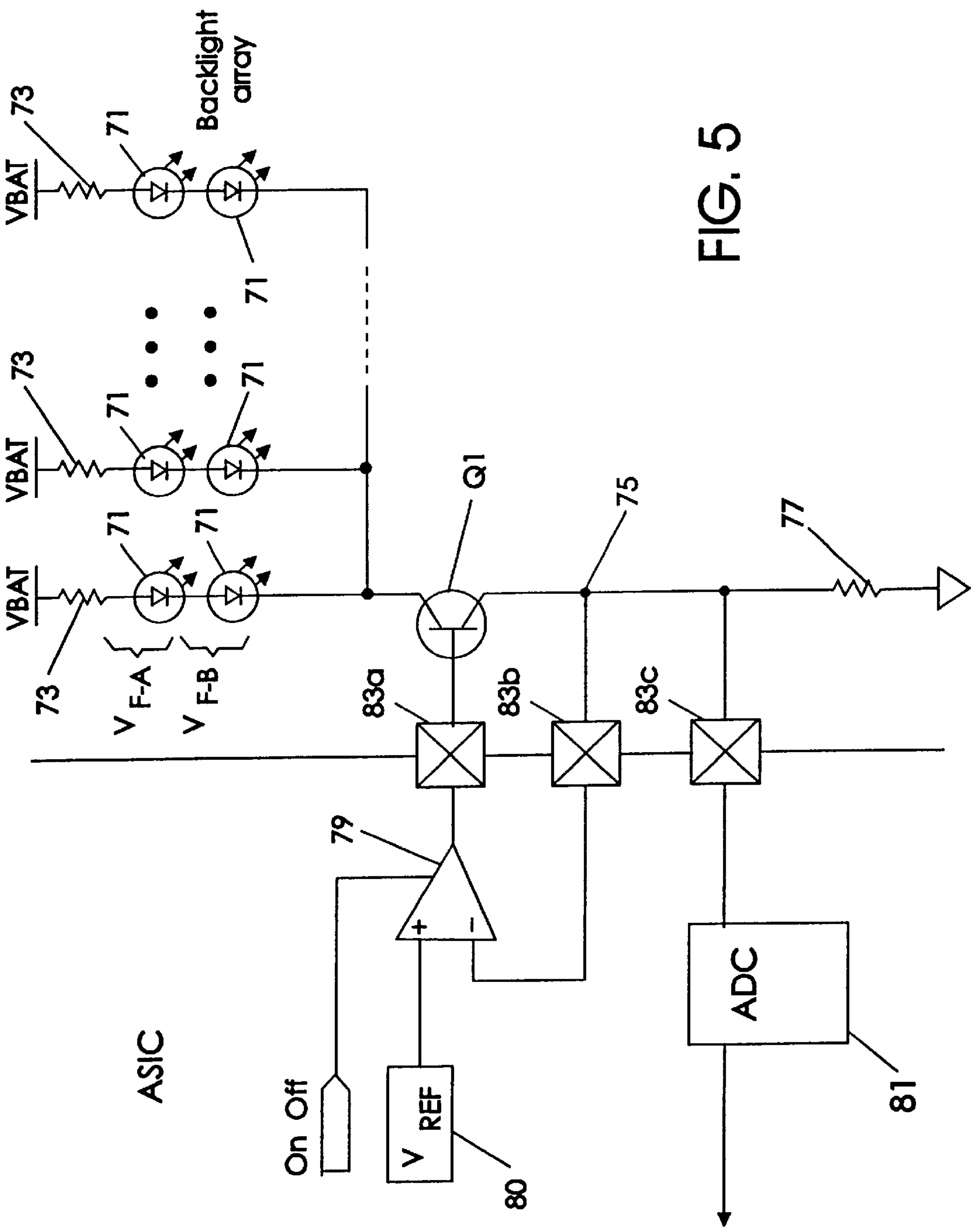
FIG. 5 is a circuit diagram illustrating a first backlighting circuit for the cellular radiotelephone of FIG. 4.

More particularly, the user interface 55 includes a keypad 61, a visual display such as a liquid crystal display (LCD) 63, and a backlighting circuit 65. The backlighting circuit is used to illuminate the keypad 61 and/or the liquid crystal display 63 for use in the dark. A first embodiment of the backlighting circuit according to the present invention is illustrated in FIG. 5. As shown, the backlighting circuit includes an array of light emitting diodes 71 wherein pairs of the LEDs are connected in series and each of the series connected pairs of LEDs are connected in parallel. In addition, a LED resistor 73 is connected in series with each series connected pair of LEDs 71. Each of the LED resistors is connected to the battery voltage VBAT, and the second of each of the diodes of each pair is connected to the collector of the NPN transistor Q1 which is used to control the current through the diode array. The emitter of the NPN transistor Q1 is connected to a feedback node 75, and a program resistor 77 is connected between the feedback node 77 and the ground voltage. Accordingly, the current through the LED array passes through the NPN transistor Q1 and the program resistor 77 to ground.

The current through the LED array and the NPN transistor is controlled by providing a control signal at the base of the NPN transistor Q1. This control signal is generated by the operational amplifier 79 in response to a comparison of the reference signal from the reference signal generator 80 and the feedback signal from the feedback node 75. As shown, the operational amplifier includes a first input electrically coupled to the reference signal generator, a second input electrically coupled to the feedback node, and an output electrically coupled to the base of the NPN transistor Q1. Moreover, a brownout detection circuit such as an Analog-To-Digital converter (ADC) 81 can be used to detect that the backlighting circuit has entered a brownout condition.

In addition, the operational amplifier 79 and the ADC 81 can be implemented in an Application Specific Integrated Circuit (ASIC). As shown, the vertical dotted line of FIG. 5 separates the elements of the backlighting circuit implemented in the ASIC to the left, and the elements of the backlighting circuit implemented with discrete components to the right according to one embodiment of the present invention. In FIG. 5, the pin-outs 83*a*, 83*b*, and 83*c* indicate connections between portions of the circuit implemented inside the ASIC and portions of the circuit implemented outside the ASIC.

The operational amplifier 79 is preferably configured as a voltage follower wherein an output thereof drives the base of the NPN transistor Q1. The feedback node 75 is connected to the emitter of the transistor Q1, and the feedback signal provided from this node to the operational amplifier thus locks the emitter voltage $V_{EMITTER}$ to the internal reference voltage $V_{REF}$. The emitter current and the total current through the light emitting diode array can thus be set by selecting the program resistor 77 according to the following formula:

$$I_{EMITTER}=V_{EMITTER}/R_{PROGRAM}=V_{REF}/R_{PROGRAM}$$

Because $V_{REF}$ can be obtained using the ASIC bandgap reference, the emitter voltage and the output current will remain relatively constant over temperature and battery voltage until the current source begins to loose compliance as the battery voltage drops. As will be understood by those having skill in the art, an ASIC bandgap reference is a precision voltage reference which provides a stable output over temperature and input supply variations.

Once the battery voltage drops to the compliance limits of the current source, the opamp output current will increase saturating the external NPN transistor and the emitter voltage of the transistor will begin to drop. By maintaining the emitter voltage within relatively high tolerances over process and environmental conditions, the emitter voltage at the feedback node 75 can be measured and used to indicate that the backlighting circuit is in a brownout condition. In particular, the input of the ADC 81 can be coupled to the feedback node 75 allowing the feedback signal to be monitored by the controller 53 which can include the system processor. In other words, when the binary output of the ADC 81 drops below a predetermined threshold, a brownout condition is recognized by the controller 53. The controller can then either turn off the operational amplifier 79 thereby turning off the current through the backlighting circuit or turn off the whole radiotelephone allowing an orderly shutdown thereof.

The brownout detection can be made more accurate with a dynamic calibration using the internal non-volatile memory 67 such as an E2ROM. The emitter voltage detected by the ADC 81 can deviate from a nominal value as a result of: (i) variations in the reference voltage $V_{REF}$ caused by internal resistor divider tolerances; (ii) input offset voltage in the operational amplifier causing $V_{EMITTER}$ to vary; and (iii) offset error in the ADC 81.

A reference can be obtained for the emitter voltage by reading the output of the ADC when the battery is charged to a voltage of greater than 5.0V. This reference can then be stored in the memory and used as a relative comparison value. A software algorithm can then be implemented in the controller that compares current emitter voltage values generated by the ADC with the reference stored in memory. When the value read by the ADC is less than the reference stored in memory by a predetermined number of bits, the controller can recognize a brownout condition and determine that the battery has reached an "end-of-life" condition. For example, when implementing the operational amplifier 79 and the ADC 81 in an ASIC, the emitter voltage can be held at 120 mV+/−10%(+/−12 mV), and the ADC can have a resolution of 3.0V/255 which is equal to approximately 12 mV. Accordingly, a decrease in the ADC output by 4-bits relative to the reference could be used to indicate backlighting brownout.

Figure 6:
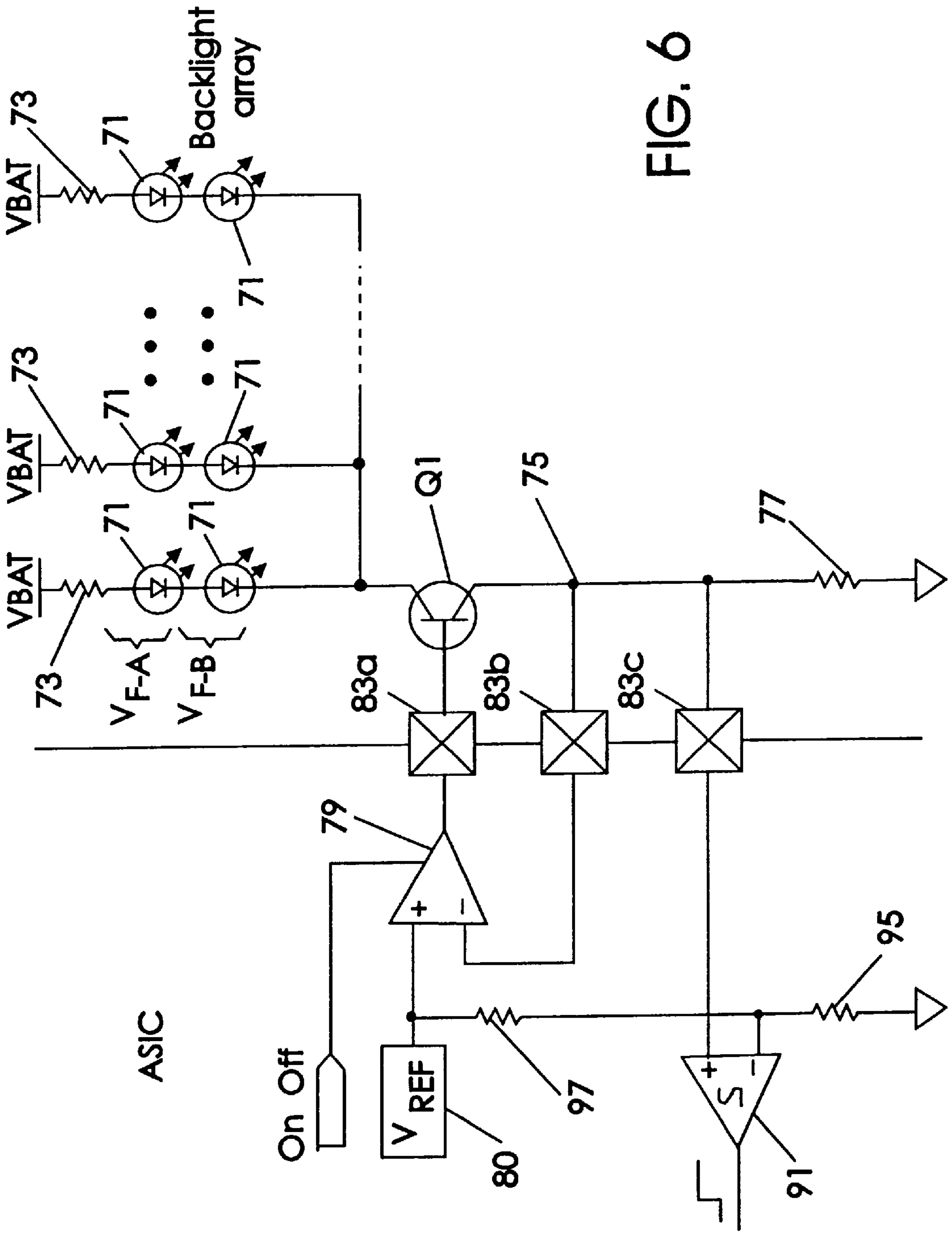
FIG. 6 is a circuit diagram illustrating a second backlighting circuit for the cellular radiotelephone of FIG. 4.

An alternate embodiment of a backlighting circuit according to the present invention is illustrated in FIG. 6. In this embodiment, the brownout detection circuit is implemented using the comparator 91 which can also be implemented as a part of the ASIC. As shown, the positive input to the comparator is connected to the feedback node 75, and the negative input to the comparator is connected to the comparison node 93 wherein a comparison voltage $V_{COMPARE}$ is generated by the voltage divider including resistors 95 and 97. Accordingly, the comparator will generate a high-to-low transition when the feedback signal (emitter voltage) falls below the comparison voltage thereby signaling a low-current or brownout condition for the backlighting circuit.

The comparison voltage can be derived using the $V_{REF}$ signal generated by the reference voltage generator 80 (such as the ASIC bandgap reference) and the resistor divider including resistors 95 and 97. Because the resistor divider is implemented within the ASIC, the resistors 95 and 97 can have matched temperature coefficients. Accordingly, the voltage delta $V_{COMPARE}-V_{REF}$ can be relatively constant over temperature and battery voltage, and any remaining errors would be due to the resistor tolerances of the ASIC manufacturing process and input offset voltages of the comparator and opamp. An effective brownout detection circuit can thus be implemented by setting the voltage delta $V_{COMPARE}-V_{REF}$ to be greater than the cumulative error.

The brownout detection circuit of FIG. 6 has the advantage that the output of the comparator can be used to drive an interrupt of the controller. In other words, the controller is not required to poll the binary output of an ADC thereby reducing processing time required to detect the brownout condition. In other words, the comparator simply indicates to the controller whether the feedback signal (emitter voltage) is in tolerance or out of tolerance. This arrangement can simplify the controller software by reducing the need to read and interpret data generated by an analog-to-digital converter. The output of the comparator can thus be provided to an interrupt of the controller or multiplexed through interrupt control logic also included in the ASIC. The brownout response algorithm can thus be moved to an interrupt service routine (ISR) thus relieving the controller of the need to poll the brownout detection circuit.

Figure 7:
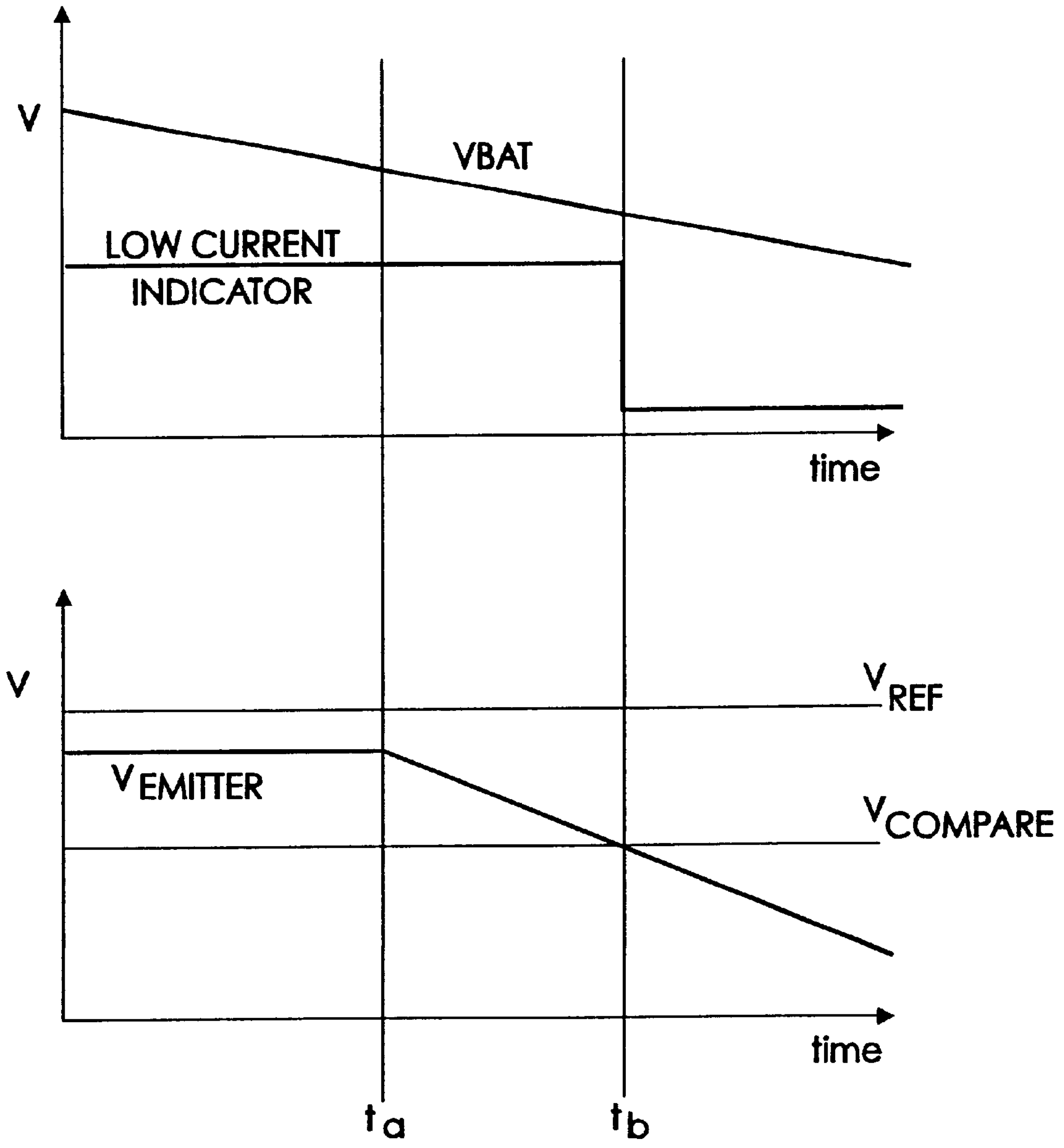
FIG. 7 is a graph illustrating the operation of the brownout detection circuit of FIG. 6.

The operation of the brownout detection circuit of FIG. 6 is illustrated in the graph of FIG. 7. As shown at time t=0, the feedback signal (emitter voltage or $V_{EMITTER}$) is slightly less than $V_{REF}$. This difference is due to the error caused by the input offset voltage in the comparator and the operational amplifier, and in practice, the emitter voltage could be greater than $V_{REF}$. In addition, the low-current indicator (output of the comparator) is high indicating that the emitter voltage is within tolerance. As the time increases, however, the battery discharges until the current source reaches the limits of compliance at time $t=t_a$. In other words, the base current into the base of transistor Q1 has increased until the transistor has reached saturation and the emitter voltage begins to fall. For $t>t_a$, the emitter voltage decreases with the battery voltage until the emitter voltage is equal to the comparison voltage $V_{COMPARE}$ at time $t_b$. At this point, the output of the comparator transitions from high-to-low indicating a brownout condition for the backlighting circuit. This transition can be used to interrupt the controller.

The use of the brownout detection circuits discussed above allows the backlighting circuit to operate until the battery can no longer support its operation without regard to external conditions because the brownout is detected based on the current through the LED array as opposed to the battery voltage. The radiotelephone controller can thus monitor the battery voltage and/or the brownout detection signal. Accordingly, the controller can determine a battery end-of-life when the 4-cell battery reaches 4.2V. In addition, the controller can determine a battery end-of-life condition before the backlighting begins to dim. The brownout detection circuit thus allows consistent backlighting while reducing unnecessary determinations that the battery has reached an end-of-life condition.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A backlighting circuit for a user interface of an electronic device, said backlighting circuit comprising:

at least one light emitting diode optically coupled to the user interface wherein said at least one light emitting diode provides backlighting for the user interface;

a current source electrically coupled in series with said at least one light emitting diode wherein said current source controls a current through said at least one light emitting diode; and a brownout detection circuit wherein said brownout detection circuit determines a brownout condition for the user interface responsive to said current through said at least one light emitting diode falls below a predetermined threshold wherein said brownout detection circuit determines a brownout condition using a comparison between a reference signal and a feedback signal from said current source; and a control circuit wherein said control circuit is electrically coupled to said brownout detection circuit and wherein said control circuit turns said current source off in response to a determination that a brownout condition has occurred.

2. A backlighting circuit according to claim 1 wherein said brownout detection circuit comprises an analog-to-digital converter.

3. A backlighting circuit according to claim 1 wherein said brownout detection circuit comprises a comparator.

4. A backlighting circuit according to claim 1 wherein said control circuit turns the electronic device off in response to the determination that the brownout condition has occurred.

5. A backlighting circuit according to claim 1 wherein said user interface comprises one of a keypad and a liquid crystal display.

6. A backlighting circuit according to claim 1 wherein said current source comprises:

a transistor electrically coupled in series between said at least one light emitting diode and a feedback node;

a program resistor electrically coupled in series between said feedback node and a ground voltage node; and an operational amplifier including a first input electrically coupled to said reference signal, a second input electrically coupled to said feedback signal at said feedback node, and an output electrically coupled to a control electrode of said transistor wherein said operational amplifier drives said control node of said transistor in response to said comparison of said reference signal and said feedback signal.

7. A backlighting circuit according to claim 1 wherein said at least one light emitting diode comprises a plurality of pairs of series coupled light emitting diodes and wherein each of said pairs of series coupled light emitting diodes is electrically coupled in parallel.

8. A backlighting circuit according to claim 1 wherein the electronic device comprises a radiocommunications device including a housing and a transceiver in the housing wherein the user interface is on the housing.

9. A backlighting circuit according to claim 1 wherein said current source comprises:

a transistor electrically coupled in series between said at least one light emitting diode and a feedback node;

a program resistor electrically coupled in series between said feedback node and a ground voltage node; and a comparison circuit including a first input electrically coupled to said reference signal, a second input electrically coupled to said feedback signal at said feedback node, and an output electrically coupled to a control electrode of said transistor wherein said comparison circuit drives said control node of said transistor in response to said comparison of said reference signal and said feedback signal.

10. A method for providing backlighting for a user interface of an electronic device including a user interface and at least one light emitting diode optically coupled to the user interface wherein the at least one light emitting diode provides backlighting for the user interface, said method comprising the step of:

determining a brownout condition for said at least one diode responsive to a current through said at least one light emitting diode falling below a predetermined threshold wherein determining the brownout condition comprises comparing a feedback signal representative of a current through the at least one diode with a reference signal; and turning said at least one light emitting diode off in response to a determination that a brownout condition has occurred.

11. A method according to claim 10 further comprising the step of:

turning the electronic device off in response to a determination that the brownout condition has occurred.

12. A backlighting circuit for a user interface of an electronic device, said backlighting circuit comprising:

at least one light emitting diode optically coupled to the user interface wherein said at least one light emitting diode provides backlighting for the user interface;

a constant current source electrically coupled in series with said at least one light emitting diode wherein said constant current source controls a current through said at least one light emitting diode in response to a comparison between a reference signal and a feedback signal from said constant current source;

a brownout detection circuit wherein said brownout detection circuit determines a brownout condition for the user interface responsive to said feedback signal wherein said brownout detection circuit determines that said brownout condition has occurred when said current through said at least one diode falls below a predetermined threshold; and a control circuit wherein said control circuit is electrically coupled to said brownout detection circuit and wherein said control circuit turns said constant current source off in response to a determination that a brownout condition has occurred.

13. A backlighting circuit according to claim 12 wherein said constant current source comprises:

a transistor electrically coupled in series between said at least one light emitting diode and a feedback node;

a program resistor electrically coupled in series between said feedback node and a ground voltage node; and an operational amplifier including a first input electrically coupled to said reference signal, a second input electrically coupled to said feedback signal at said feedback node, and an output electrically coupled to a control electrode of said transistor wherein said operational amplifier drives said control node of said transistor in response to said comparison of said reference signal and said feedback signal.

14. A backlighting circuit according to claim 13 wherein said operational amplifier is implemented as a portion of an Application Specific Integrated Circuit (ASIC).

15. A backlighting circuit according to claim 12 wherein said at least one light emitting diode comprises a plurality of pairs of series coupled light emitting diodes and wherein each of said pairs of series coupled light emitting diodes is electrically coupled in parallel.

16. A backlighting circuit according to claim 12 wherein said user interface comprises one of a keypad and a liquid crystal display.

17. A backlighting circuit according to claim 12 wherein the electronic device comprises a radiocommunications device including a housing and a transceiver in the housing wherein the user interface is on the housing.

18. A backlighting circuit according to claim 12 wherein said constant current source comprises:

a transistor electrically coupled in series between said at least one light emitting diode and a feedback node;

a program resistor electrically coupled in series between said feedback node and a ground voltage node; and a comparison circuit including a first input electrically coupled to said reference signal, a second input electrically coupled to said feedback signal at said feedback node, and an output electrically coupled to a control electrode of said transistor wherein said comparison circuit drives said control node of said transistor in response to said comparison of said reference signal and said feedback signal.

19. A method for providing backlighting for a user interface of an electronic device including a user interface and at least one light emitting diode optically coupled to the user interface wherein the at least one light emitting diode provides backlighting for the user interface, said method comprising the step of:

comparing a feedback signal representative of a current through the at least one light emitting diode with a reference signal;

controlling a current through the at least one light emitting diode in response to said comparison between said reference signal and said feedback signal; and determining a brownout condition for the user interface responsive to comparing the feedback signal representative of the current through the at least one diode with the reference signal to determine that said current through said at least one light emitting diode has fallen below a predetermined threshold; and turning the electronic device off in response to a determination that a brownout condition has occurred.

20. A method according to claim 19 further comprising the step of:

turning the electronic device off in response to a determination that a brownout condition has occurred.

* * * * *

UNITED STATES PATENT AND TRADEMARK OFFICE

CERTIFICATE OF CORRECTION

PATENT NO. : 6,107,985

DATED : August 22, 2000

INVENTOR(S) : Joel J. Walukas et al;

It is certified that error appears in the above-identified patent and that said Letters Patent is hereby corrected as shown below:

Claim 18, column 10, line 24 delete "constant"

Signed and Sealed this

Twenty-ninth Day of May, 2001

Attest:

Nicholas P. Godici

NICHOLAS P. GODICI

*Attesting Officer*

*Acting Director of the United States Patent and Trademark Office*